(12) United States Patent
Chiba et al.

(10) Patent No.: US 12,111,362 B2
(45) Date of Patent: Oct. 8, 2024

(54) BATTERY UNIT

(71) Applicant: HONDA MOTOR CO., LTD., Tokyo (JP)

(72) Inventors: Kazuki Chiba, Saitama (JP); Toshiyuki Ariga, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 180 days.

(21) Appl. No.: 18/065,631

(22) Filed: Dec. 14, 2022

(65) Prior Publication Data

US 2023/0266394 A1 Aug. 24, 2023

(30) Foreign Application Priority Data

Feb. 18, 2022 (JP) .................. 2022-023918

(51) Int. Cl.
| | |
|---|---|
| *G01R 31/374* | (2019.01) |
| *G01R 31/367* | (2019.01) |
| *G01R 31/3835* | (2019.01) |
| *G01R 31/396* | (2019.01) |
| *H01M 10/44* | (2006.01) |
| *H01M 10/48* | (2006.01) |
| *H02J 7/00* | (2006.01) |

(52) U.S. Cl.
CPC ......... *G01R 31/374* (2019.01); *G01R 31/367* (2019.01); *G01R 31/3835* (2019.01); *G01R 31/396* (2019.01); *H01M 10/441* (2013.01); *H01M 10/482* (2013.01); *H01M 10/486* (2013.01); *H01M 2220/20* (2013.01); *H02J 7/0048* (2020.01)

(58) Field of Classification Search
CPC ........ G01R 31/27; G01R 31/31; G01R 31/32; G01R 31/36; G01R 31/374; G01R 31/3835; G01R 31/367; G01R 31/388; G01R 31/392; G01R 31/396; H01M 10/44; H01M 10/48
See application file for complete search history.

(56) References Cited

U.S. PATENT DOCUMENTS

| | | | |
|---|---|---|---|
| 2010/0052617 A1 | 3/2010 | Aridome et al. | |
| 2012/0166116 A1 | 6/2012 | Yoshida et al. | |
| 2019/0187004 A1* | 6/2019 | Durrer | ................ H01M 10/486 |

FOREIGN PATENT DOCUMENTS

| | | |
|---|---|---|
| JP | 5044511 B2 | 10/2012 |
| JP | 5287844 B2 | 9/2013 |

* cited by examiner

*Primary Examiner* — Neel D Shah
(74) *Attorney, Agent, or Firm* — CKC & Partners Co., LLC

(57) ABSTRACT

A battery unit includes: a module including m cell groups that are connected in series and each include n cells connected in parallel; m voltage detectors; (m×(n−1)) heat flow detectors; a storage; and a state estimator. The storage stores a table map of OCV vs. SOC characteristics (A1) and a table map of HF vs. SOC characteristics (A2). For each of the m cell groups, the state estimator is configured to: determine, based on the (A2), a true SOC of (n−1) cells that corresponds to a heat flow detected; determine, based on the (A1), an OCV of the (n−1) cells that corresponds to the determined true SOC; calculates an OCV of a remaining cell from the determined OCV and a detected composite voltage; and determine, based on the (A1), a true SOC of the remaining cell that corresponds to the calculated OCV.

12 Claims, 7 Drawing Sheets

BATTERY UNIT

This application is based on and claims the benefit of priority from Japanese Patent Application No. 2022-023918, filed on 18 Feb. 2022, the content of which is incorporated herein by reference.

BACKGROUND OF THE INVENTION

Field of the Invention

The present disclosure relates to a battery unit.

Related Art

In recent years, battery units have been widely used as energy sources for driving widespread electric devices and electronic devices of various sizes, such as automobiles, personal computers, and information terminals. In particular, in the field of automobiles, interest in electric vehicles is growing, and use of the battery units as vehicle-mountable devices is under study, in order to reduce adverse global environmental impact and in order to reduce $CO_2$ and improve the global environment from the viewpoint of climate-related hazards and natural disasters.

A technique for estimating a state of battery cells in a battery unit, such as a state of charge (SOC) or a state of health (SOH) plays an important role in efficiently and safely using the electronic devices and electrical devices. For example, it has been known that a state of battery cells such as the SOC or the SOH correlates with a voltage of the battery cells. There are known techniques according to which a state of the battery cells, such as the SOC or the SOH, is estimated based on a voltage of the battery cells (see, for example, Japanese Patent Nos. 5287844 and 5044511).
Patent Document 1: Japanese Patent No. 5287844
Patent Document 2: Japanese Patent No. 5044511

SUMMARY OF THE INVENTION

The present disclosure relates to a technique for estimating the SOC as a state of battery cells. The SOC can be estimated in the following manner. Open circuit voltage (OCV) vs. SOC characteristics of the battery cell are stored in advance in the form of a plurality of table maps associated with respective temperatures. For example, when neither charge nor discharge is being performed, one of the table maps corresponding to a detected temperature is referred to, whereby a SOC corresponding to a detected voltage of each battery cell is estimated as the SOC of the battery cell.

A battery unit usually includes a plurality of battery cells connected in series and in parallel. In particular, in a battery unit including battery cells connected in parallel, a voltage detected for each battery cell become a composite voltage of the battery cells connected in parallel, and may differ from the OCV of each battery cell. In such a case where the SOC is estimated on the basis of the detected voltage different from the OCV and with reference to a table map of OCV vs. SOC characteristics, there will be a discrepancy between the estimated SOC and the true SOC, thereby achieving a low estimation accuracy.

In this respect, the present inventors have found that a SOC of a battery cell correlates also with a heat flow HF of the battery cell caused by, for example, phase transition of an active material of an electrode material. Accordingly, the present inventors have devised a method of estimating the SOC of a battery cell based on the heat flow of the battery cell. According to this SOC estimation method, HF vs. SOC characteristics of a battery cell are stored in advance in the form of a table map. For example, when neither charge nor discharge is being performed, the table map is referred to, whereby a SOC corresponding to a heat flow detected for each battery cell is estimated as the SOC of each battery cell.

However, heat flow detection means is expected to be more expensive than voltage detection means. From the viewpoint of cost and the like, it is impractical to provide such heat flow detection means to battery cells on a one-to-one basis.

It is an object of the present disclosure to provide a battery unit capable of estimating a SOC of battery cells with improved accuracy, while reducing an increase in cost.

A first aspect of the present disclosure is directed to a battery unit including: a battery module including battery cells, the battery module including m battery cell groups connected in series, each of the m battery cell groups including n battery cells among the battery cells, the n battery cells being connected in parallel in each of the m battery cell groups, the battery cells totaling (m×n) battery cells; m voltage detectors provided to the m battery cell groups on a one-to-one basis, each of the m voltage detectors being configured to detect, for an associated one of the m battery cell groups, a composite voltage of the n battery cells; (m×(n−1)) battery heat flow detectors provided, on a one-to-one basis, to (n−1) battery cells among the n battery cells included in each of the m battery cell groups, each of the (m×(n−1)) battery heat flow detectors being configured to detect a heat flow of an associated one of the (n−1) battery cells; a storage configured to store (A1) and (A2) below,
  (A1): a table map of open circuit voltage OCV vs. state of charge SOC characteristics of the battery cell, and
  (A2): a table map of heat flow HF vs. SOC characteristics of the battery cell; and
a battery state estimator configured to estimate SOCs of all the (m×n) battery cells, based on the composite voltage detected for each of the m battery cell groups, the heat flow detected for each of (m×(n−1)) battery cells among the (m×n) battery cells, the (A1), and the (A2). For each of the m battery cell groups, the battery state estimator is configured to: determine, based on the (A2), a true SOC of each battery cell of the (n−1) battery cells, the true SOC corresponding to the heat flow detected for the battery cell, determine, based on the (A1), an OCV of each battery cell of the (n−1) battery cells, the OCV corresponding to the true SOC determined for the battery cell, calculate an OCV of a remaining one battery cell, from the OCV determined for each battery cell of the (n−1) battery cells and the composite voltage detected, and determine, based on the (A1), a true SOC of the remaining one battery cell, the true SOC corresponding to the OCV calculated for the remaining one battery cell.

According to a second aspect, in the battery unit of the first aspect, in a case where the n battery cells in each of the m battery cell groups are numbered in a same direction, the (m×(n−1)) battery heat flow detectors may be provided to the (n−1) battery cells among the n battery cells included in each of the m battery cell groups, the (n−1) battery cells being denoted by same ordinal numbers in the m battery cell groups.

According to a third aspect, in the battery unit of the first aspect, the storage may be configured to further store (A11) below, (A11): a table map of closed circuit voltage CCV vs. SOC characteristics of the battery cell, and for each of the m battery cell groups, the battery state estimator may be further configured to: determine, based on the (A11), a CCV of each battery cell of the (n−1) battery cells, the CCV corresponding to the true SOC determined for the battery cell, and calculate a CCV of the remaining one battery cell, from the CCV determined for each battery cell of the (n−1) battery cells and the composite voltage detected.

A fourth aspect of the present disclosure is directed to another battery unit including: a battery module including battery cells, the battery module including m battery cell groups connected in parallel, each of the m battery cell groups including n battery cells among the battery cells, the n battery cells being connected in series in each of the m battery cell groups, the battery cells totaling (m×n) battery cells; (m×n) voltage detectors provided to all the (m×n) battery cells on a one-to-one basis, each of the (m×n) voltage detectors being configured to detect a voltage of an associated one of the (m×n) battery cells; (m×1) battery heat flow detectors each provided to one battery cell among the n battery cells included in each of the m battery cell groups, each of the (m×1) battery heat flow detectors being configured to detect a heat flow of the one battery cell; a storage configured to store (A1) and (A2) below, (A1): a table map of open circuit voltage OCV vs. state of charge SOC characteristics of the battery cell, and (A2): a table map of heat flow HF vs. SOC characteristics of the battery cell; and a battery state estimator configured to estimate SOCs of all the (m×n) battery cells, based on the voltage detected for each of the (m×n) battery cells, the heat flow detected for each of (m×1) battery cells among the (m×n) battery cells, the (A1), and the (A2). For each of the m battery cell groups, the battery state estimator is configured to: determine, based on the (A2), a true SOC of the one battery cell, the true SOC corresponding to the heat flow detected for the one battery cell, determine, based on the (A1), an OCV of the one battery cell, the OCV corresponding to the true SOC determined for the one battery cell, calculate an OCV differential voltage between the OCV determined for the one battery cell and the voltage detected for the one battery cell, calculate an OCV of each of remaining (n−1) battery cells among the n battery cells, from the voltage detected for each of the remaining (n−1) battery cells and the OCV differential voltage calculated, and determine, based on the (A1), a true SOC of each of the remaining (n−1) battery cells, the true SOC corresponding to the OCV calculated for each of the remaining (n−1) battery cells.

According to a fifth aspect, in the battery unit of the fourth aspect, in a case where the n battery cells in each of the m battery cell groups are numbered in a same direction, the (m×1) battery heat flow detectors may each be provided to the one battery cell among the n battery cells included in each of the m battery cell groups, the one battery cell being denoted by a same ordinal number in the m battery cell groups.

According to a sixth aspect, in the battery unit of the fourth aspect, the storage may be configured to further store (A11) below, (A11): a table map of closed circuit voltage CCV vs. SOC characteristics of the battery cell, and for each of the m battery cell groups, the battery state estimator may be further configured to: determine, based on the (A11), a CCV of the one battery cell, the CCV corresponding to the true SOC determined for the one battery cell, calculate a CCV differential voltage between the CCV determined for the one battery cell and the voltage detected for the one battery cell, and calculate a CCV of each of the remaining (n−1) battery cells, from the voltage detected for each of the remaining (n−1) battery cells and the CCV differential voltage calculated.

A seventh aspect of the present disclosure is directed to a yet another battery unit including: a battery module including battery cells, the battery module including m battery cell groups connected in parallel, each of the m battery cell groups including n battery cells among the battery cells, the n battery cells being connected in series in each of the m battery cell groups, the battery cells totaling (m×n) battery cells; (m×n) voltage detectors provided to all the (m×n) battery cells on a one-to-one basis, each of the (m×n) voltage detectors being configured to detect a voltage of an associated one of the (m×n) battery cells; one voltage detector provided to the battery module and configured to detect a composite voltage of the m battery cell groups; ((m−1)×1) battery heat flow detectors each provided to one battery cell among the n battery cells included in each of (m−1) battery cell groups among the m battery cell groups, each of the ((m−1)×1) battery heat flow detectors being configured to detect a heat flow of the one battery cell; a storage configured to store (A1) and (A2) below, (A1): a table map of open circuit voltage OCV vs. state of charge SOC characteristics of the battery cell, and (A2): a table map of heat flow HF vs. SOC characteristics of the battery cell; and a battery state estimator configured to estimate SOCs of all the (m×n) battery cells, based on the voltage detected for each of the (m×n) battery cells, the composite voltage detected for the m battery cell groups, the heat flow detected for each of ((m−1)×1) battery cells among the (m×n) battery cells, the (A1), and the (A2). For each of the (m−1) battery cell groups, the battery state estimator is configured to: determine, based on the (A2), a true SOC of the one battery cell, the true SOC corresponding to the heat flow detected for the one battery cell, determine, based on the (A1), an OCV of the one battery cell, the OCV corresponding to the true SOC determined for the one battery cell, calculate an OCV differential voltage between the OCV determined for the one battery cell and the voltage detected for the one battery cell, calculate an OCV of each of remaining (n−1) battery cells among the n battery cells, from the voltage detected for each of the remaining (n−1) battery cells and the OCV differential voltage calculated, and determine, based on the (A1), a true SOC of each of the remaining (n−1) battery cells, the true SOC corresponding to the OCV calculated for each of the remaining (n−1) battery cells. The battery state estimator is further configured to: calculate a total OCV of each of the (m−1) battery cell groups, from the OCV determined for the one battery cell and the OCV calculated for each of the remaining (n−1) battery cells, and calculate a total OCV of remaining one battery cell group of the m battery cell groups, from the total OCV calculated for each of the (m−1) battery cell groups and the composite voltage detected for the m battery cell groups. For the remaining one battery cell group, the battery state estimator is further configured to: calculate a total detected voltage of the n battery cells, from the voltage detected for each of the n battery cells, calculate a total OCV differential voltage of the n battery cells, from a difference between the total OCV calculated and the total detected voltage calculated, calculate an OCV differential voltage of each of the n battery cells by equally dividing the total OCV differential voltage calculated for the n battery cells, calculate an OCV of each of the n battery cells, from the voltage detected for each of the n battery cells and the OCV differential voltage calculated for each of the n battery cells, and determine, based on the (A1), a true SOC of each of the n battery cells, the true SOC corresponding to the OCV calculated for each of the n battery cells.

According to an eighth aspect, in the battery unit of the seventh aspect, in a case where the n battery cells in each of the (m−1) battery cell groups are numbered in a same direction, the ((m−1)×1) battery heat flow detectors may each be provided to the one battery cell among the n battery cells included in each of the (m−1) battery cell groups, the one battery cell being denoted by a same ordinal number in the (m−1) battery cell groups.

According to a ninth aspect, in the battery unit of the seventh aspect, the storage may be configured to further store (A11) below, (A11): a table map of closed circuit voltage CCV vs. SOC characteristics of the battery cell, and for each of the (m−1) battery cell groups, the battery state estimator may be further configured to: determine, based on the (A11), a CCV of the one battery cell, the CCV corresponding to the true SOC determined for the one battery cell, calculate a CCV differential voltage between the CCV determined for the one battery cell and the voltage detected for the one battery cell, and calculate a CCV of each of the remaining (n−1) battery cells, from the voltage detected for each of the remaining (n−1) battery cells and the CCV differential voltage calculated. The battery state estimator may be further configured to: calculate a total CCV of each of the (m−1) battery cell groups, from the CCV determined for the one battery cell and the CCV calculated for each of the remaining (n−1) battery cells, and calculate a total CCV of remaining one battery cell group of the m battery cell groups, from the total CCV calculated for each of the (m−1) battery cell groups and the composite voltage detected for the m battery cell groups. For the remaining one battery cell group, the battery state estimator may be further configured to: calculate a total CCV differential voltage of the n battery cells, from a difference between the total CCV calculated and the total detected voltage calculated, calculate a CCV differential voltage of each of the n battery cells by equally dividing the total CCV differential voltage calculated for the n battery cells, and calculate a CCV of each of the n battery cells, from the voltage detected for each of the n battery cells and the CCV differential voltage calculated for each of the n battery cells.

According to a tenth aspect, the battery unit of any one of the foregoing aspects may further include a reference heat flow detector configured to detect a heat flow of the battery unit as a reference heat flow, and the battery state estimator may subtract the reference heat flow detected by the reference heat flow detector from the heat flow detected by the battery heat flow detectors to thereby calculate a heat flow excluding effects of the heat flow of the battery unit, and may use the heat flow excluding the effects of the heat flow of the battery unit as the heat flow of the battery cell.

The first to tenth aspects of the present disclosure make it possible to improve estimation accuracy for the SOC of battery cells, in comparison with a case where the SOC of battery cells are estimated based on a table map of OCV vs. SOC characteristics and a voltage detected for the battery cells. Furthermore, the first to tenth aspects of the present disclosure make it possible to improve estimation accuracy for the OCV of battery cells. Moreover, the first to tenth aspects of the present disclosure allow a smaller number of the battery heat flow detectors to be used, thereby making it possible to improve estimation accuracy for the SOC and OCV of battery cells, while reducing an increase in cost.

According to the second, fifth, and eighth aspects of the present disclosure, the battery heat flow detectors can be arranged at positions aligned over all the battery cell groups (e.g., in proximity to the center or in proximity to an end of each battery cell group), for example. This arrangement makes it possible to reduce errors in the detected heat flow that can be caused depending on arrangement positions of the battery heat flow detectors in the battery cell groups, whereby variance in the estimation accuracy for the SOC and variance in the estimation accuracy for the OCV of the battery cells can be reduced between the battery cell groups.

The third, sixth, and ninth aspects makes it possible to improve estimation accuracy for the CCV of the battery cells.

According to the tenth aspect of the present disclosure, the estimation is performed based on the heat flow excluding noise of the battery unit, thereby making it possible to further improve the estimation accuracy for the SOC, the estimation accuracy for the OCV, and the estimation accuracy for the CCV of the battery cells.

DETAILED DESCRIPTION OF THE INVENTION

Figure 1:
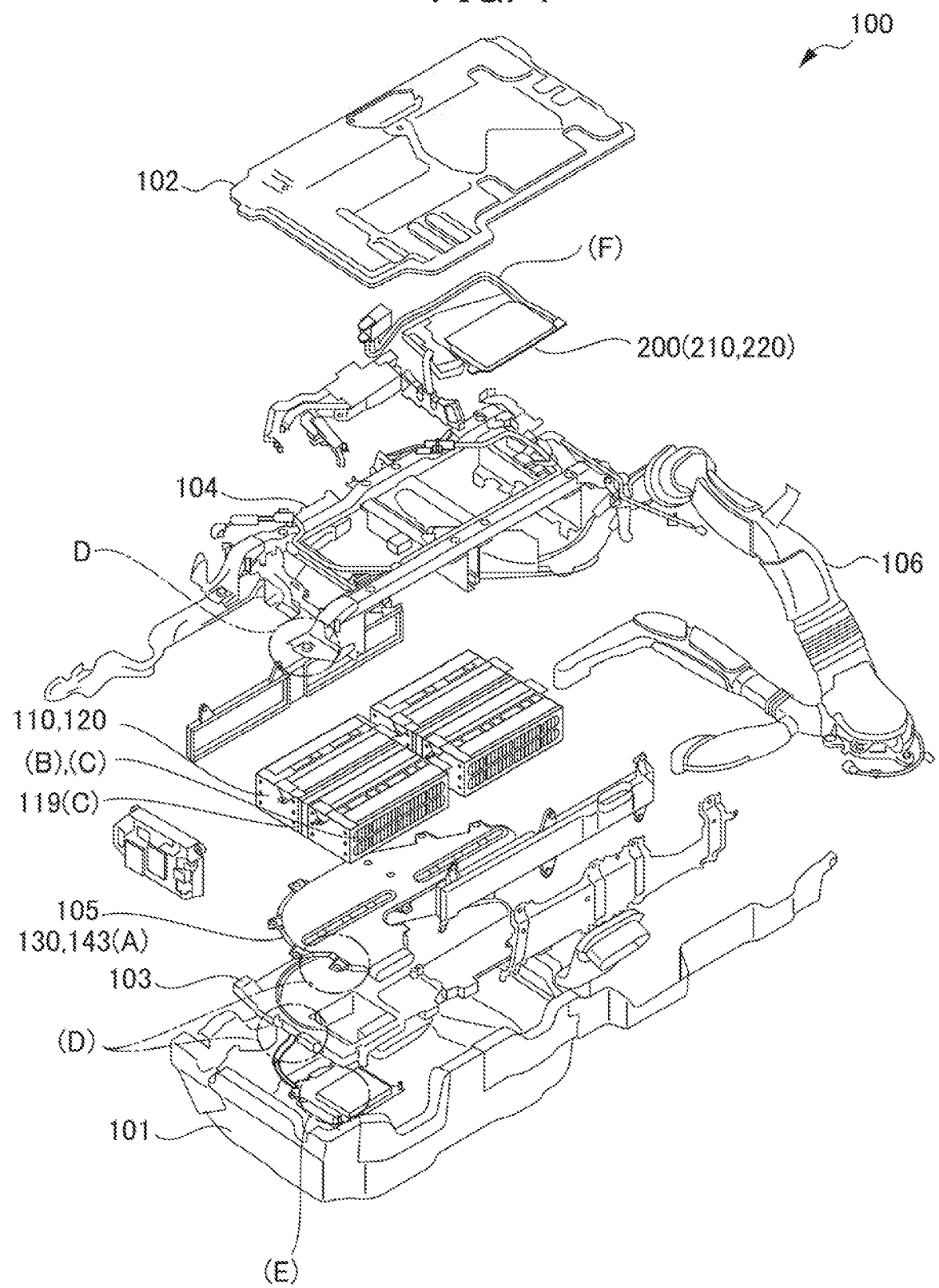
FIG. 1 is an exploded perspective view illustrating a battery unit according to an embodiment.

An example of embodiments of the present disclosure will be described below with reference to the accompanying drawings. In the drawings, the same or equivalent components are denoted by the same reference character.

Battery Unit

Figure 2A:
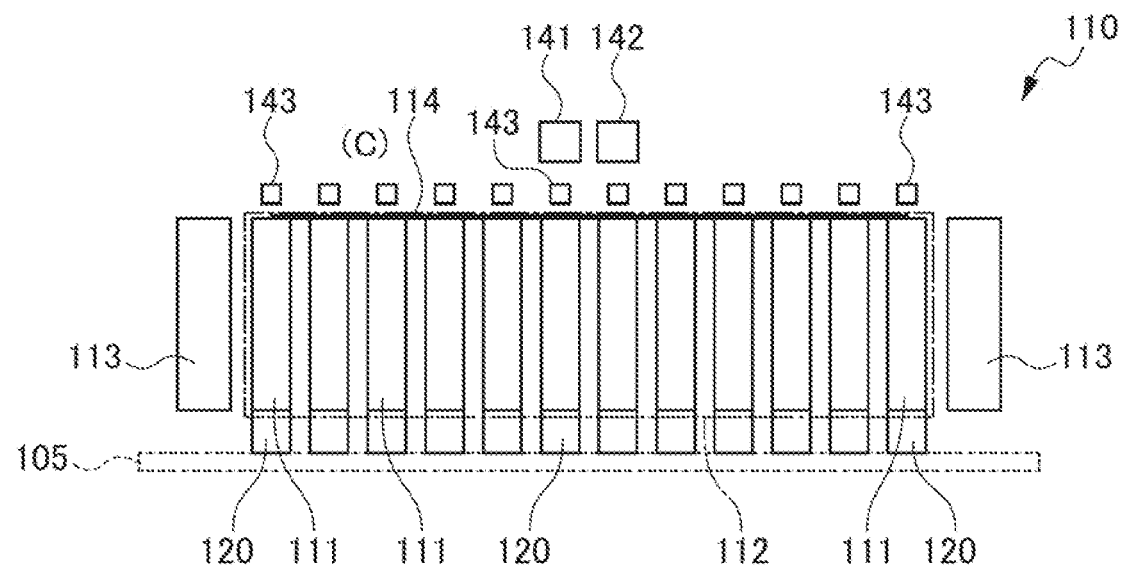
FIG. 2A is a side view of an example of a battery module in the battery unit illustrated in FIG. 1.

FIG. 1 is an exploded perspective view schematically illustrating a battery unit according to the present embodiment. FIG. 2A is a side view schematically illustrating an example of a battery module that can be included in the battery unit illustrated in FIG. 1. The battery unit 100 illustrated in FIG. 1 is a battery pack (also referred to as an intelligent power unit: IPU) mountable on an electric vehicle, such as a hybrid electric vehicle (HEV), a hybrid electric vehicle with an external power supply function (plug-in hybrid electric vehicle: PHEV), or a battery electric vehicle (BEV).

As illustrated in FIGS. 1 and 2A, the battery unit 100 includes, as main components, battery modules 110, battery heat flow detectors 120, a reference heat flow detector 130, a voltage detector 141, a current detector 142, temperature detectors 143, and a battery management system (BMS) 200. In the example illustrated in FIG. 1, the components of the battery unit 100 are housed in a case 101 and covered with a cover 102.

In the example illustrated in FIG. 1, the battery unit 100 further includes a lower frame 103 and an upper frame 104. The battery unit 100 further includes a lower cooling plate 105 for cooling the battery modules 110. The battery unit 100 further includes a mechanism 106 (e.g., a fan, a cooling air duct, and an intake duct) that introduces air to cool the battery modules 110.

As illustrated in FIG. 2A, each battery module 110 has, as main components, a stack 112 including a plurality of battery cells 111 stacked together, a pair of end plates 113 sandwiching the stack 112 in the stacking direction, and a cell bus bar 114 connecting the plurality of battery cells 111 to each other. As illustrated in FIG. 1, the plurality of battery modules 110 may be connected to each other via a module bus bar 119.

The battery cells 111 may be any type of battery cell, non-limiting examples of which include lithium-ion batteries. Among such lithium-ion batteries, the following battery is preferable: a lithium-ion battery with a negative electrode containing a material that generates heat due to a phase transition or the like, such as graphite; or a lithium-ion battery with a positive electrode containing a material that generates heat due to a phase transition or the like, such as lithium cobalt oxide (LCO) as a layered compound or lithium nickel oxide (LNO) as a layered compound.

In the following, a lithium-ion battery will be described which includes a negative electrode containing graphite as a material that generates heat due to a phase transition or the like; and a positive electrode containing lithium nickel cobalt manganese oxide (NCM) as a layered compound (that is, for the lithium-ion battery to be described below, a SOC of 0% is mainly determined depending on a potential of the negative electrode; negative electrode cut). Note that the present disclosure can be similarly applied to a lithium-ion battery (whose SOC of 0% is mainly determined depending on a potential of the positive electrode; positive electrode cut), which includes a positive electrode containing a material such as LCO or LNO that generates heat due to a phase transition or the like.

The battery heat flow detectors 120 are heat flow sensors that detect a heat flow of the battery cells 111 and the battery unit 100. In other words, the heat flow detected by the battery heat flow detectors 120 is composed of not only the heat flow of the battery cells 111, but also a heat flow affected by various heat flows in the battery unit 100, namely effects of noise.

The heat flow sensor may be any type of sensor, non-limiting example of which include temperature sensors such as a Peltier element, a thermopile, and a thermocouple. Among these sensors, a Peltier element that has high heat flow sensitivity and can also be used as a temperature control device is preferable. As illustrated in FIG. 2A, a Peltier element for cooling the battery cells 111 may be disposed between the battery cells 111 and the cooling plate 105. In this case, the Peltier element can be used for both heat flow detection and cooling. For example, the Peltier element can be used as a heat flow sensor when a heat flow is to be detected, and otherwise, it can be used as a cooler.

It is only necessary for each battery heat flow detector 120 to be disposed on or adjacent to at least one or some of the battery cells 111 included in the battery module 110. As illustrated in FIG. 2A, the battery heat flow detectors 120 may be disposed on or adjacent to the battery cells 111 located next to the end plates 113. The battery heat flow detector 120 may further be disposed on or adjacent to one battery cell 111 located at the center in the stacking direction of the battery cells 111, in addition to the battery cells 111 next to the end plates 113.

The reference heat flow detector 130 is a heat flow sensor that detects, as a reference heat flow, a heat flow of the battery unit 100, the heat flow being composed of various heat flows in the battery unit 100, namely heat flows of noise.

Similarly to the above, the heat flow sensor may be any type of sensor, non-limiting example of which include temperature sensors such as a Peltier element, a thermopile, and a thermocouple. Among these sensors, the Peltier element is preferable. The Peltier element can be used for both cooling the battery cells 111 and detecting the heat flow.

The reference heat flow detector 130 is disposed in the battery unit 100 at a location where temperature fluctuation is small and heat capacity is large. For example, the reference heat flow detector(s) 130 can be disposed at any of the following locations (A) to (F).

(A) Cooling Plate 105 for Cooling the Battery Modules 110

For example, as illustrated in FIG. 1, the cooling plate 105 is disposed in contact with the bottom surfaces of the battery modules 110, and the reference heat flow detector 130 is disposed on or adjacent to a surface of the cooling plate 105, the surface not facing the bottom surfaces of the battery cells 111. Although the reference heat flow detector 130 can be disposed at any position with respect to the plurality of battery cells 111, it may be disposed at, for example, a position corresponding to one battery cell 111 at the center in the stacking direction of the battery cells 111.

(B) End Plates 113 of the Battery Modules 110

Figure 2B:
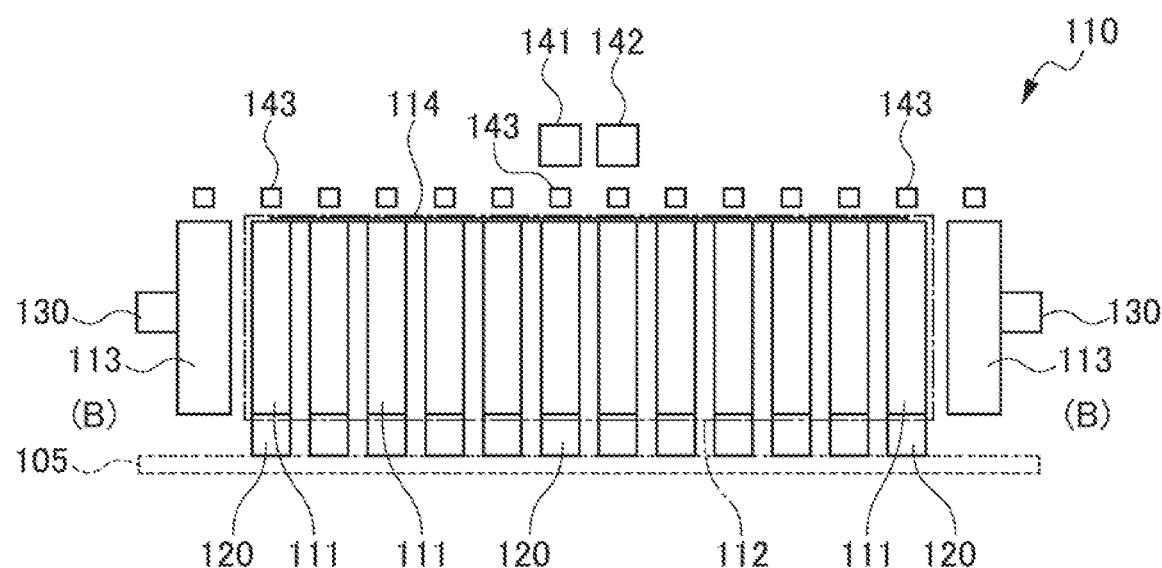
FIG. 2B is a side view of another example of the battery module in the battery unit illustrated in FIG. 1.

FIG. 2B is a side view illustrating another example of a battery module that can be included in the battery unit illustrated in FIG. 1. As illustrated in FIG. 2B, for example, the reference heat flow detector 130 may be disposed on or adjacent to a surface of each end plate 113, the surface not facing the battery cells 111.

(C) Bus Bar 114, 119 of the Battery Modules 110

For example, the reference heat flow detector 130 may be disposed on or adjacent to a surface of the cell bus bar 114 connecting the battery cells to each other (see FIG. 2A), the surface not facing the battery cells 111. For example, the reference heat flow detector 130 may be disposed on or adjacent to a surface of the module bus bar 119 connecting the battery modules 110 to each other (see FIG. 1), the surface not facing the battery cells 111. Although the reference heat flow detector 130 can be disposed at any position with respect to the plurality of battery cells 111, it may be disposed at, for example, a position corresponding to one battery cell 111 at the center in the stacking direction of the battery cells 111.

(D) Flange in the Battery Unit 100

For example, as illustrated in FIG. 1, the reference heat flow detector 130 may be disposed on or adjacent to a flange (joint) which is provided in the battery unit 100 and via which the battery modules are fixed.

(E) Space within the Battery Unit 100

For example, as illustrated in FIG. 1, the reference heat flow detector 130 may be disposed in a floating manner in a space within the battery unit 100.

(F) Pipe Protecting a High-Voltage Conductor Wire

For example, as illustrated in FIG. 1, the reference heat flow detector 130 may be disposed inside or outside a pipe that protects a high-voltage conductor wire (e.g., inside the pipe if the pipe is exposed to outside air, or outside the pipe if the pipe is not exposed to outside air).

The battery heat flow detectors 120 may be disposed on or adjacent to the two battery cells 111 that are next to the end plates 113, and the reference heat flow detector 130 may be disposed on or adjacent to one of the battery cells 111 that is different from the two on or adjacent to which the battery heat flow detectors 120 are disposed (e.g., one battery cell 111 located at the center in the stacking direction of the battery cells 111).

The voltage detector 141 is a voltage sensor that detects a voltage of the battery cells 111. The voltage detector 141 may be disposed at any location. For example, as illustrated in FIG. 2A, the voltage detector 141 may be disposed on or adjacent to the battery module 110. FIGS. 2A and 2B schematically illustrate the arrangement of the battery cells 111 and the voltage detectors 141. The details of the arrangement of the battery cells 111 and the voltage detectors 141 will be described later.

The current detector 142 is a current sensor that detects a current of the battery cells 111. The current detector 142 may be disposed at any location. For example, as illustrated in FIG. 2A, the current detector 142 may be disposed on or adjacent to the battery module 110.

The temperature detectors 143 are temperature sensors that detect temperatures of the respective components. The temperature sensor may be any type of temperature sensor, a non-limiting example of which includes a thermocouple. As illustrated in FIG. 2A, each temperature detector 143 is disposed on or adjacent to an associated one of the battery cells 111 and detects the temperature of the associated battery cell 111. The temperature detectors 143 are also disposed at the positions where the battery heat flow detectors 120 are disposed, and detect temperatures of the heat flow detection positions. As illustrated in FIGS. 1 and 2B, the temperature detectors 143 are also disposed at the positions where the reference heat flow detectors 130 are disposed, and detect temperatures of the heat flow detection positions.

Battery Management System: Battery State Estimator

The battery management system (BMS, also referred to as the electronic control unit: ECU) 200 performs overall control of the battery cells 111, including charge/discharge control, over-charge protection, over-discharge protection, and monitoring of a state of the battery (e.g., a state of charge (SOC) or a state of health (SOH)) of the battery cells 111. The battery management system 200 includes, as main components, a battery state estimator 210 and a storage 220.

The battery state estimator 210 includes, for example, an arithmetic processor, such as a digital signal processor (DSP) and a field-programmable gate array (FPGA). The battery state estimator 210 performs various functions by executing, for example, predetermined software (programs) stored in the storage 220. The various functions of the battery state estimator 210 may be performed by way of cooperation of hardware and software, or may be performed only by hardware (electronic circuitry).

For example, the storage 220 is a rewritable memory, such as an EEPROM. The storage 220 stores the predetermined software (programs) for allowing the battery state estimator 210 to perform the above-mentioned various functions.

Figure 3:
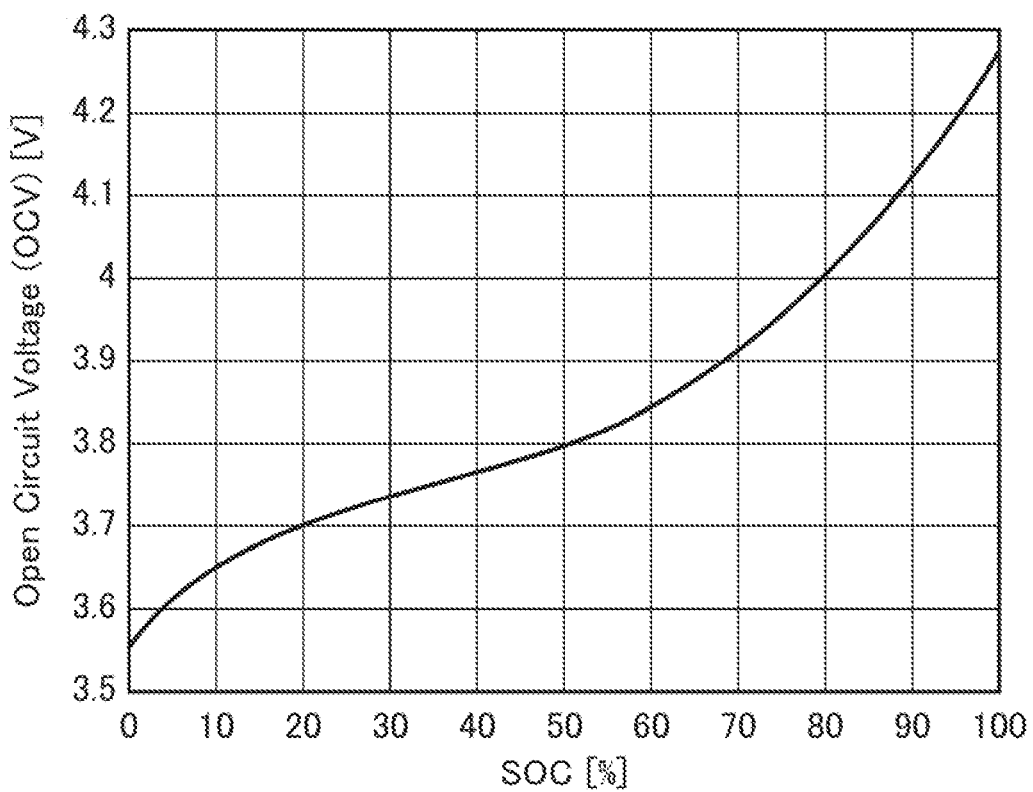
FIG. 3 illustrates, as an example, OCV vs. SOC characteristics according to an embodiment.

As illustrated in FIG. 3, the storage 220 stores, in a table map format, characteristics relating to a correlation between the open circuit voltage and the SOC (OCV vs. SOC characteristics) of the battery cell 111 in, for example, an initial state, which are a plurality of characteristics of the battery cell 111 each associated with a temperature (A1). The storage 220 may store a plurality of table maps of the OCV vs. SOC characteristics prepared in accordance with degradation states (e.g., a low degradation state, an intermediate degradation state, etc.) of the battery cell 111. This configuration makes it possible to switch between the table maps of the OCV vs. SOC characteristics in accordance with the degradation state of the battery cell 111.

Likewise, the storage 220 stores, in a table map format, characteristics relating to a correlation between the closed circuit voltage and the SOC (CCV vs. SOC characteristics) of the battery cell 111 in, for example, an initial state, which are a plurality of characteristics of the battery cell 111 each associated with a temperature and a current (charge) (A11). The storage 220 may store a plurality of table maps of the CCV vs. SOC characteristics prepared in accordance with degradation states (e.g., a low degradation state, an intermediate degradation state, etc.) of the battery cell 111. This configuration makes it possible to switch between the table maps of the CCV vs. SOC characteristics in accordance with the degradation state of the battery cell 111.

Figure 4:
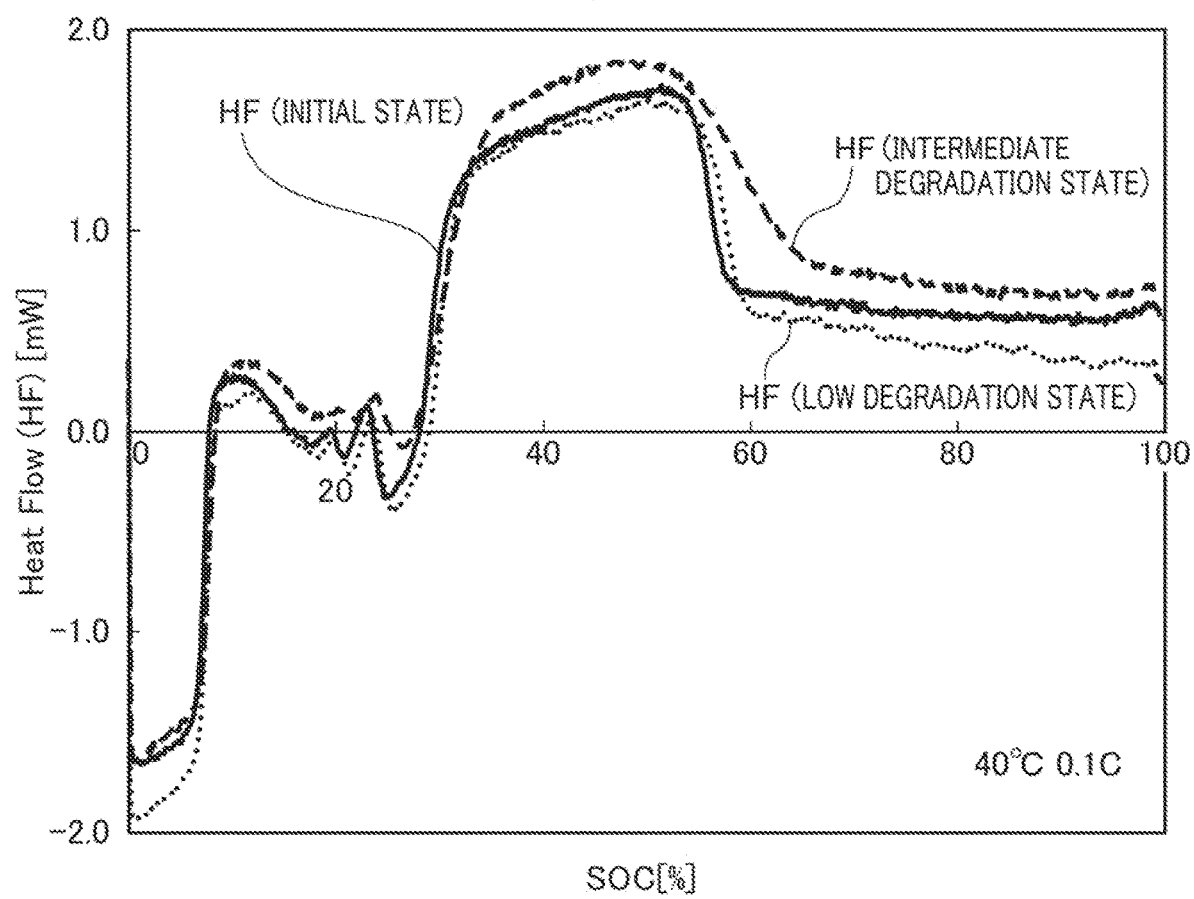
FIG. 4 illustrates, as an example, HF vs. SOC characteristics in an initial state, a low degradation state, and an intermediate degradation state according to an embodiment.

Further, as illustrated in FIG. 4, the storage 220 stores, in a table map format, characteristics relating to a correlation between the heat flow and the SOC (HF vs. SOC characteristics) of the battery cell 111 in, for example, an initial state, which are a plurality of characteristics of the battery cell 111 each associated with a temperature and a current (charge) (A2). As illustrated in FIG. 4, the storage 220 may store a plurality of table maps of the of HF vs. SOC characteristics prepared in accordance with degradation states (e.g., a low degradation state, an intermediate degradation state, etc.) of the battery cell 111. This configuration makes it possible to switch between the table maps of the HF vs. SOC characteristics in accordance with the degradation state of the battery cell 111.

For example, in actual use in a vehicle, when neither charge nor discharge is being performed, such as when the vehicle is at a standstill, the battery state estimator 210 operates:

to refer to the table map of the OCV vs. SOC characteristics (A1), the table map of the CCV vs. SOC characteristics (A11), and the table map of the HF vs. SOC characteristics (A2), which are stored in the storage 220; and to thereby estimate the SOC, OCV, and/or CCV of the battery cell 111 based on a voltage of the battery cell 111 detected by the voltage detector 141 and a heat flow of the battery cell 111 detected by the battery heat flow detector 120. The details will be described later (SOC Estimation 1 to SOC Estimation 3).

Note that as the heat flow HF of the battery cells 111, a heat flow detected by the battery heat flow detector 120 may be used as it is. Alternatively, as the heat flow HF of the battery cells 111, a heat flow calculated by subtracting a reference heat flow detected by the reference heat flow detector 130 from a heat flow detected by the battery heat flow detector 120 may be used. This makes it possible to determine the heat flow of the battery cells 111 excluding effects of various heat flows in the battery unit 100, that is, excluding the effects of noise. A heat flow of the battery cells 111 on the positive electrode side and a heat flow of the battery cells 111 on the negative electrode side may be averaged to be defined as the heat flow HF of the battery cells 111.

Here, it is known that the SOC of a battery cell correlates with a voltage of the battery cell. There are known techniques according to which the SOC of a battery cell is estimated based on a voltage of the battery cell. According to such a SOC estimation method, OCV vs. SOC characteristics of the battery cell are stored in advance as a plurality of table maps each associated with a temperature. For example, when neither charge nor discharge is being performed, such as when a vehicle equipped with the battery cell in actual use is at a standstill, one table map corresponding to a detected temperature is referred to, and a SOC corresponding to the detected temperature is estimated as the SOC of the battery cell.

However, a battery unit includes a plurality of battery cells connected in series and in parallel. Especially because of the parallel connection, the voltage detected for each battery cell become a composite voltage of the battery cells connected in parallel, and may differ from the OCV of each battery cell. In such a case where the SOC is estimated on the basis of the detected voltage different from the OCV and with reference to a table map of OCV vs. SOC characteristics, there will be a discrepancy between the estimated SOC and the true SOC, thereby achieving a low estimation accuracy.

In this respect, the present inventors have found that a SOC of a battery cell correlates also with a heat flow HF of the battery cell caused by, for example, phase transition of an active material of an electrode material. Accordingly, the present inventors have devised a method of estimating the SOC of a battery cell based on the heat flow of the battery cell. According to this SOC estimation method, HF vs. SOC characteristics of a battery cell are stored in advance in the form of a table map. For example, when neither charge nor discharge is being performed, such as when a vehicle equipped with the battery cells in actual use is at a standstill, the table map is referred to, whereby a SOC corresponding to a heat flow detected for each battery cell is estimated as the SOC of each battery cell.

However, heat flow detection means is expected to be more expensive than voltage detection means. From the viewpoint of cost and the like, it is impractical to provide such heat flow detection means to battery cells on a one-to-one basis.

To address the foregoing, the present inventors have devised the following processes for SOC Estimations 1 to 3 that can increase the estimation accuracy for the SOC of battery cells even in a case where a smaller number of heat flow detection means is used with respect to the number of battery cells.

SOC Estimation 1

Figure 5:
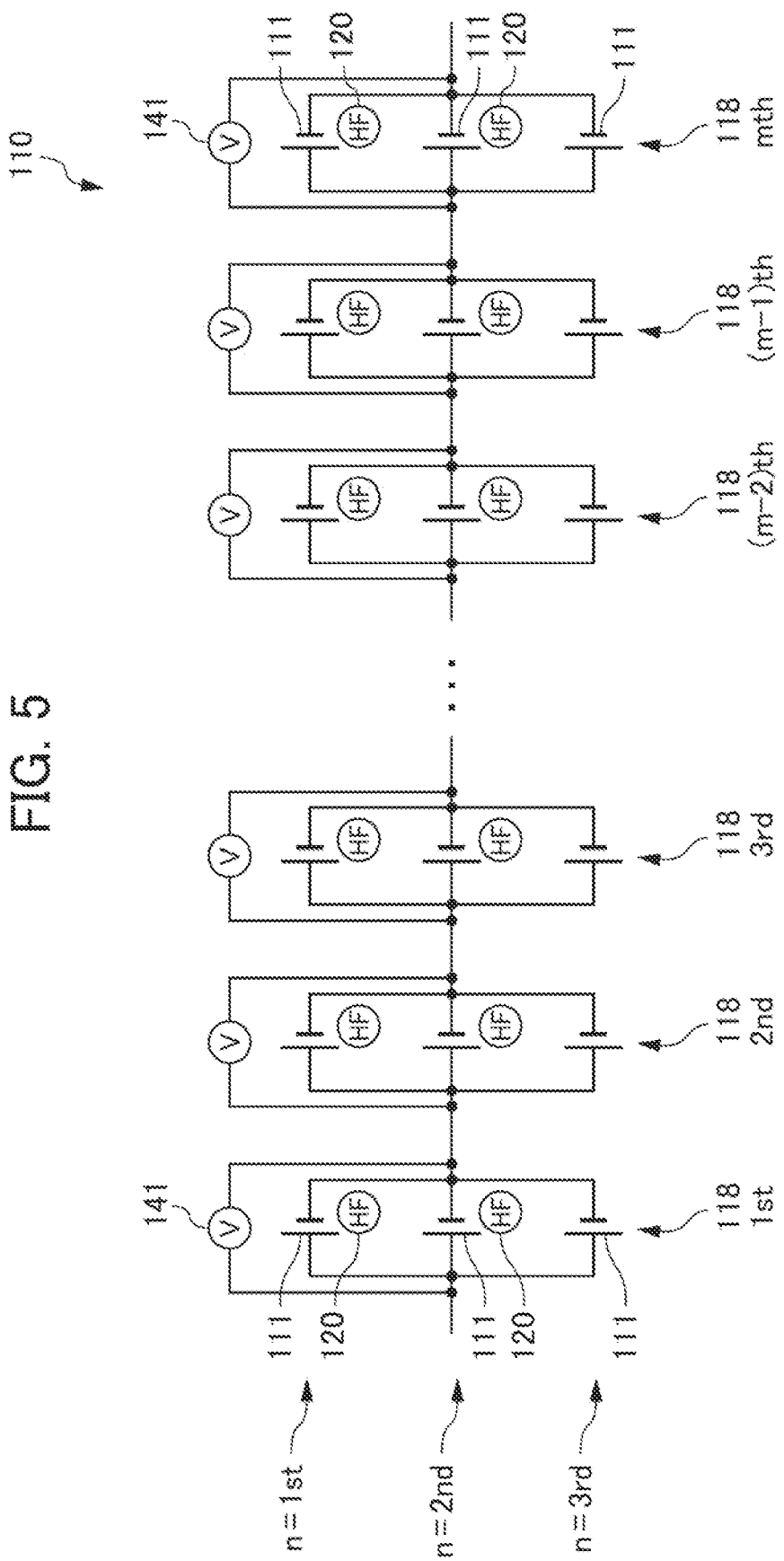
FIG. 5 is a diagram illustrating an example of SOC Estimation 1 for battery cells according to an embodiment.

First, an example of SOC estimation is described by referring to FIG. 5, which illustrates a case where the battery module 110 includes m battery cell groups 118 connected in series, and each of the m battery cell groups 118 includes n battery cells 111 (n=3 in the example of FIG. 5) connected in parallel.

In this case, the voltage detector 141 includes m voltage detectors 141 provided to the m battery cell groups 118 on a one-to-one basis. Each of the m voltage detectors 141 detects, for an associated one of the m battery cell groups 118, a composite voltage of the n battery cells 111 connected in parallel.

In this case, the battery heat flow detector 120 includes (m×(n−1)) battery heat flow detectors 120 provided, on a one-to-one basis, to (n−1) battery cells 111 among the n battery cells 111 included in the m battery cell groups 118. Each of the (m×(n−1)) battery heat flow detectors 120 detects a heat flow of an associated one of the (n−1) battery cells 111 included in each of the m battery cell groups 118.

In each of the m battery cell groups 118, the n battery cells are numbered in the same direction. For example, in FIG. 5, the n battery cells are numbered in the top-to-bottom direction. In this case, it is preferable that the (m×(n−1)) battery heat flow detectors 120 are provided to (n−1) battery cells 111 among the n battery cells 111 included in each of the m battery cell groups 118, the (n−1) battery cells 111 being denoted by same ordinal numbers in the m battery cell groups 118. For example, in FIG. 5, in each of the m battery cell groups 118, two battery heat flow detectors 120 are provided to the first and second battery cells 111 from the top. In this way, the battery heat flow detectors 120 are arranged at positions aligned over all the m battery cell groups 118 (for example, in proximity to the center or in proximity to an end of each battery cell group 118). This arrangement makes it possible to reduce errors in the detected heat flow that can be caused depending on arrangement positions of the battery heat flow detectors 120 in the battery cell groups 118. As a result, variance in the estimation accuracy for the SOC, variance in the estimation accuracy for the OCV, and/or variance in the estimation accuracy for the CCV of the battery cells 111 can be reduced between the battery cell groups 118.

The battery state estimator 210 estimates the SOCs of all the (m×n) battery cells 111, based on the composite voltage detected for each of the m battery cell groups 118, the heat flow detected for each of the (m×(n−1)) battery cells 111, the table map of the OCV vs. SOC characteristics (A1), and the table map of the HF vs. SOC characteristics (A2).

Specifically, the battery state estimator 210 determines, for each of the m battery cell groups 118, a true SOC of each battery cell 111 of the (n−1) battery cells 111 that corresponds to the heat flow detected for the battery cell 111, based on the table map of the HF vs. SOC characteristics (A2) (FIG. 4). For example, in the case illustrated in FIG. 5, the battery state estimator 210 determines, for each of the m battery cell groups 118, a true SOC of each of the first and second battery cells 111 from the top.

Next, the battery state estimator 210 determines, for each of the m battery cell groups 118, an OCV of each battery cell 111 of the (n−1) battery cells 111 that corresponds to the true SOC determined for the battery cell 111, based on the table map of the OCV vs. SOC characteristics (A1) (FIG. 3). For example, in the case illustrated in FIG. 5, the battery state estimator 210 determines, for each of the m battery cell groups 118, an OCV of each of the first and second battery cells 111 from the top.

Next, the battery state estimator 210 calculates, for each of the m battery cell groups 118, an OCV of the remaining one battery cell 111 from the OCV determined for each of the (n−1) battery cells 111 and the composite voltage detected for the n battery cells 111 connected in parallel. For example, in the case illustrated in FIG. 5, the battery state estimator 210 calculates, for each of the m battery cell groups 118, an OCV of the third battery cell 111 from the top, from the OCV of each of the first and second battery cells 111 from the top and the detected composite voltage.

Next, the battery state estimator 210 determines, for each of the m battery cell groups 118, a true SOC of the remaining one battery cell 111 that corresponds to the OCV calculated for the remaining one battery cell 111, based on the table map of the OCV vs. SOC characteristics (A1) (FIG. 3). For example, in the case illustrated in FIG. 5, the battery state estimator 210 determines, for each of the m battery cell groups 118, a true SOC of the third battery cell 111 from the top.

As described above, SOC Estimation 1 of the present embodiment, according to which the SOC of each battery cell is estimated on the basis of the heat flow detected for the battery cell and with reference to the HF vs. SOC characteristic, makes it possible to estimate the SOC of each battery cell with improved accuracy. As a result, overcharge and overdischarge of each battery cell can be suppressed. Furthermore, SOC Estimation 1 of the present embodiment makes it possible to estimate the OCV of each of the battery cells connected in parallel. As a result, charge and discharge of each battery cell can be safely controlled such that the voltage of each battery cell can be prevented from falling outside the upper and lower limits of a voltage range.

Furthermore, SOC Estimation 1 of the present embodiment allows a smaller number of the battery heat flow detectors 120 to be used, with respect to the number of battery cells 111 (i.e., the (m×(n−1)) battery heat flow detectors 120 with respect to the (m×n) battery cells 111). In other words, in terms of n battery cells connected in parallel, the number of battery heat flow detectors to be used can be reduced by one. Thus, the estimation accuracy for the SOC and OCV of each battery cell can be improved while reducing an increase in cost.

According to SOC Estimation 1 of the present embodiment, the CCV of each battery cell 111 may be estimated based on the table map of the CCV vs. SOC characteristics (A11). Specifically, for each of the m battery cell groups 118, the battery state estimator 210 may perform the estimation by:

determining, based on the table map of the CCV vs. SOC characteristics (A11), the CCV of each battery cell 111 of the (n−1) battery cells 111 that corresponds to the true SOC determined for the battery cell 111 calculated in the above-described manner; and calculating the CCV of the remaining one battery cell 111, from the CCV determined for each of the (n−1) battery cells 111 and the detected composite voltage.

As a result, charge and discharge of each battery cell can be safely controlled such that the voltage of each battery cell can be prevented from falling outside the upper and lower limits of a voltage range.

SOC Estimation 2

Figure 6:
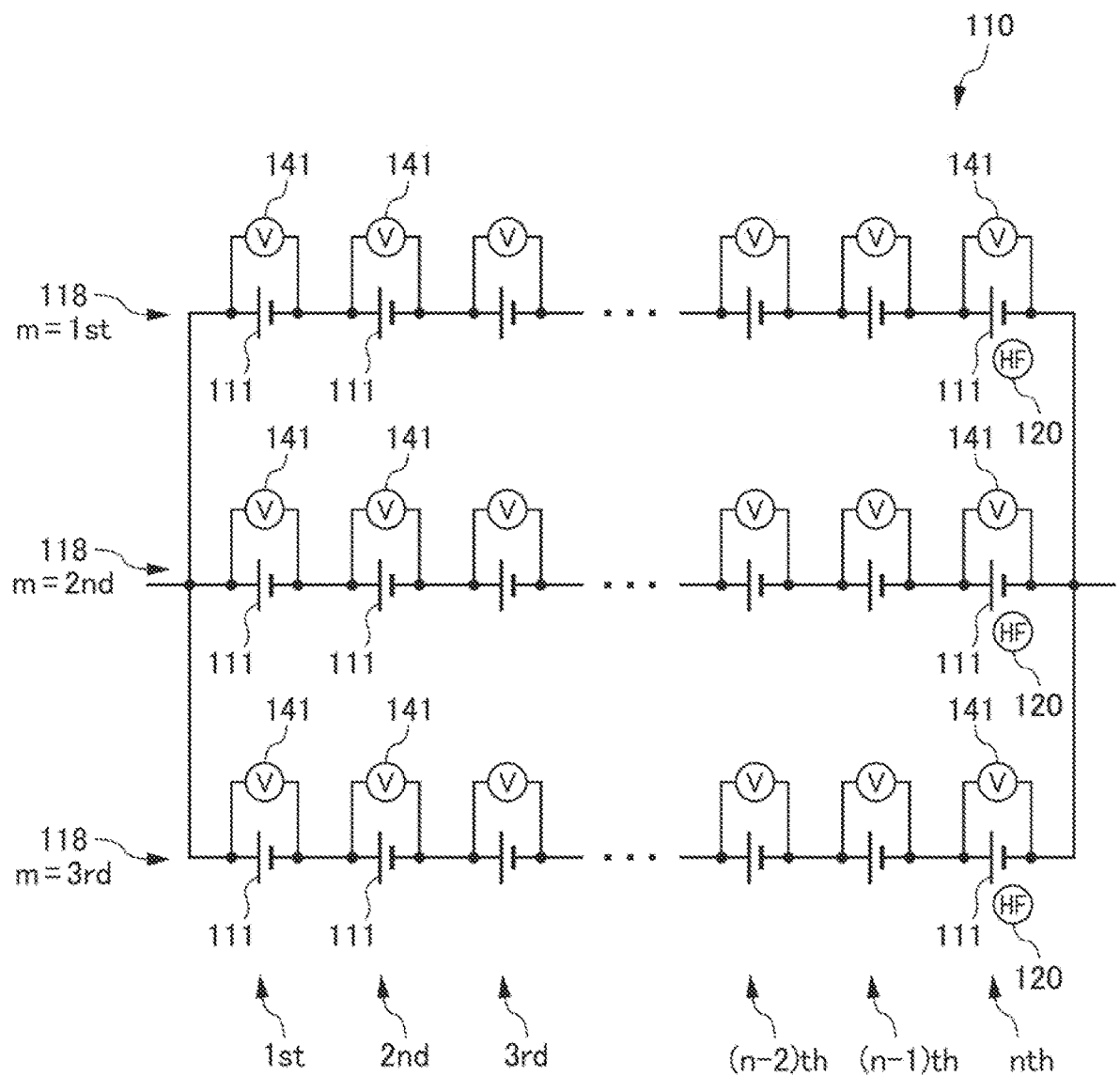
FIG. 6 is a diagram illustrating an example of SOC Estimation 2 for battery cells according to an embodiment.

Next, an example of SOC estimation is described by referring to FIG. 6, which illustrates a case where the battery module 110 includes m battery cell groups 118 (m=3 in the example of FIG. 6) connected in parallel, and each of the m battery cell groups 118 includes n battery cells 111 connected in series.

In this case, the voltage detector 141 includes (m×n) voltage detectors 141 provided to the (m×n) battery cells 111 on a one-to-one basis. Each of the (m×n) voltage detectors 141 detects a voltage of an associated one of the (m×n) battery cells 111.

In this case, the battery heat flow detector 120 includes (m×1) battery heat flow detectors 120 each provided to one battery cell 111 among the n battery cells 111 included in each of the m battery cell groups 118. Each of the (m×1) battery heat flow detectors 120 detects, for an associated one of the m battery cell groups 118, a heat flow of the one battery cell 111.

In each of the m battery cell groups 118, the n battery cells are numbered in the same direction. For example, in FIG. 6, the n battery cells are numbered in the left-to-right direction. In this case, it is preferable that the (m×1) battery heat flow detectors 120 are each provided to one battery cell 111 among the n battery cells 111 included in each of the m battery cell groups 118, the one battery cell being denoted by the same ordinal number in the m battery cell groups 118. For example, in FIG. 6, in each of the m battery cell groups 118, one battery heat flow detector 120 is provided to the nth battery cell 111 from the left. In this way, the battery heat flow detectors 120 are arranged at positions aligned over all the m battery cell groups 118 (for example, in proximity to the center or in proximity to an end of each battery cell group 118). This arrangement makes it possible to reduce errors in the detected heat flow that can be caused depending on arrangement positions of the battery heat flow detectors 120 in the battery cell groups 118. As a result, variance in the estimation accuracy for the SOC, variance in the estimation accuracy for the OCV, and/or variance in the estimation accuracy for the CCV of the battery cells 111 can be reduced between the battery cell groups 118.

The battery state estimator 210 estimates SOCs of all the (m×n) battery cells 111, based on the voltage detected for each of the (m×n) battery cells 111, the heat flow detected for each of the (m×1) battery cells 111, the table map of the OCV vs. SOC characteristics (A1), and the table map of the HF vs. SOC characteristics (A2).

Specifically, the battery state estimator 210 determines, for each of the m battery cell groups 118, a true SOC of one battery cell 111 that corresponds to the heat flow detected for the one battery cell 111, based on the table map of the HF vs. SOC characteristics (A2) (FIG. 4). For example, in the case illustrated in FIG. 6, the battery state estimator 210 determines, for each of the m battery cell groups 118, a true SOC of the nth battery cell 111 from the left.

Next, the battery state estimator 210 determines, for each of the m battery cell groups 118, an OCV of the one battery cell 111 that corresponds to the true SOC determined for the one battery cells 111, based on the table map of the OCV vs. SOC characteristics (A1) (FIG. 3). For example, in the case illustrated in FIG. 6, the battery state estimator 210 determines, for each of the m battery cell groups 118, an OCV of the nth battery cell 111 from the left.

Next, the battery state estimator 210 calculates, for each of the m battery cell groups 118, a differential voltage (OCV) between the OCV determined for the one battery cell 111 and the voltage detected for the one battery cell 111. For example, in the case illustrated in FIG. 6, the battery state estimator 210 calculates, for each of the m battery cell groups 118, a differential voltage (OCV) between the voltage detected and the OCV calculated for the nth battery cell 111 from the left.

Here, in each battery cell group 118, the battery cells 111 are in the same temperature environment. Therefore, the battery cells 111 in the same battery cell group 118 have the same differential voltage (OCV) between the detected voltage and the OCV. Accordingly, the battery state estimator 210 subsequently calculates, for each of the m battery cell groups 118, an OCV of each of remaining (n−1) battery cells 111, from the voltage detected for each of the remaining (n−1) battery cells 111 and the calculated differential voltage (OCV). For example, in the case illustrated in FIG. 6, the battery state estimator 210 calculates, for each of the m battery cell groups 118, an OCV of each of the remaining first to (n−1)th battery cells 111, from the voltage detected for each of the remaining first to (n−1)th battery cells 111 and the differential voltage (OCV) of the nth battery cell 111.

Next, the battery state estimator 210 determines, for each of the m battery cell groups 118, a true SOC of each of the remaining (n−1) battery cells 111 that corresponds to the OCV calculated for each of the remaining (n−1) battery cells 111, based on the table map of the OCV vs. SOC characteristics (A1) (FIG. 3). For example, in the case illustrated in FIG. 6, the battery state estimator 210 determines, for each of the m battery cell groups 118, a true SOC of each of the remaining first to (n−1)th battery cells 111.

As described above, SOC Estimation 2 of the present embodiment, according to which the SOC of each battery cell is estimated on the basis of the heat flow detected for the battery cell and with reference to the HF vs. SOC characteristics, also makes it possible to estimate the SOC of each battery cell with improved accuracy, like SOC Estimation 1 described above. As a result, overcharge and overdischarge of each battery cell can be suppressed. Furthermore, SOC Estimation 2 of the present embodiment also makes it possible to estimate the OCV of each of the battery cells connected in parallel, like SOC Estimation 1 described above. As a result, charge and discharge of each battery cell can be safely controlled such that the voltage of each battery cell can be prevented from falling outside the upper and lower limits of a voltage range.

Furthermore, SOC Estimation 2 of the present embodiment also allows a smaller number of the battery heat flow detectors 120 to be used, with respect to the number of battery cells 111 (i.e., the (m×1) battery heat flow detectors 120 with respect to the (m×n) battery cells 111). In other words, in terms of n battery cells connected in series, the number of the battery heat flow detectors to be used can be reduced by (n−1). Thus, the estimation accuracy for the SOC and OCV of each battery cell can be improved while reducing an increase in cost.

According to SOC Estimation 2 of the present embodiment, a CCV of each battery cell 111 may be estimated based on the table map of the CCV vs. SOC characteristics (A11). Specifically, for each of the m battery cell groups 118, the battery state estimator 210 may perform estimation by:
- determining, based on the table map of the CCV vs. SOC characteristics (A11), a CCV of the one battery cell 111 that corresponds to the true SOC of the one battery cell 111 determined in the above-described manner;
- calculating a differential voltage (CCV) between the CCV determined for the one battery cell 111 and the voltage detected for the one battery cell 111; and
- calculating a CCV of each of the remaining (n−1) battery cells 111, from the voltage detected for each of the remaining (n−1) battery cells 111 and the calculated differential voltage (CCV).

As a result, charge and discharge of each battery cell can be safely controlled such that the voltage of each battery cell can be prevented from falling outside the upper and lower limits of a voltage range.

SOC Estimation 3

Figure 7:
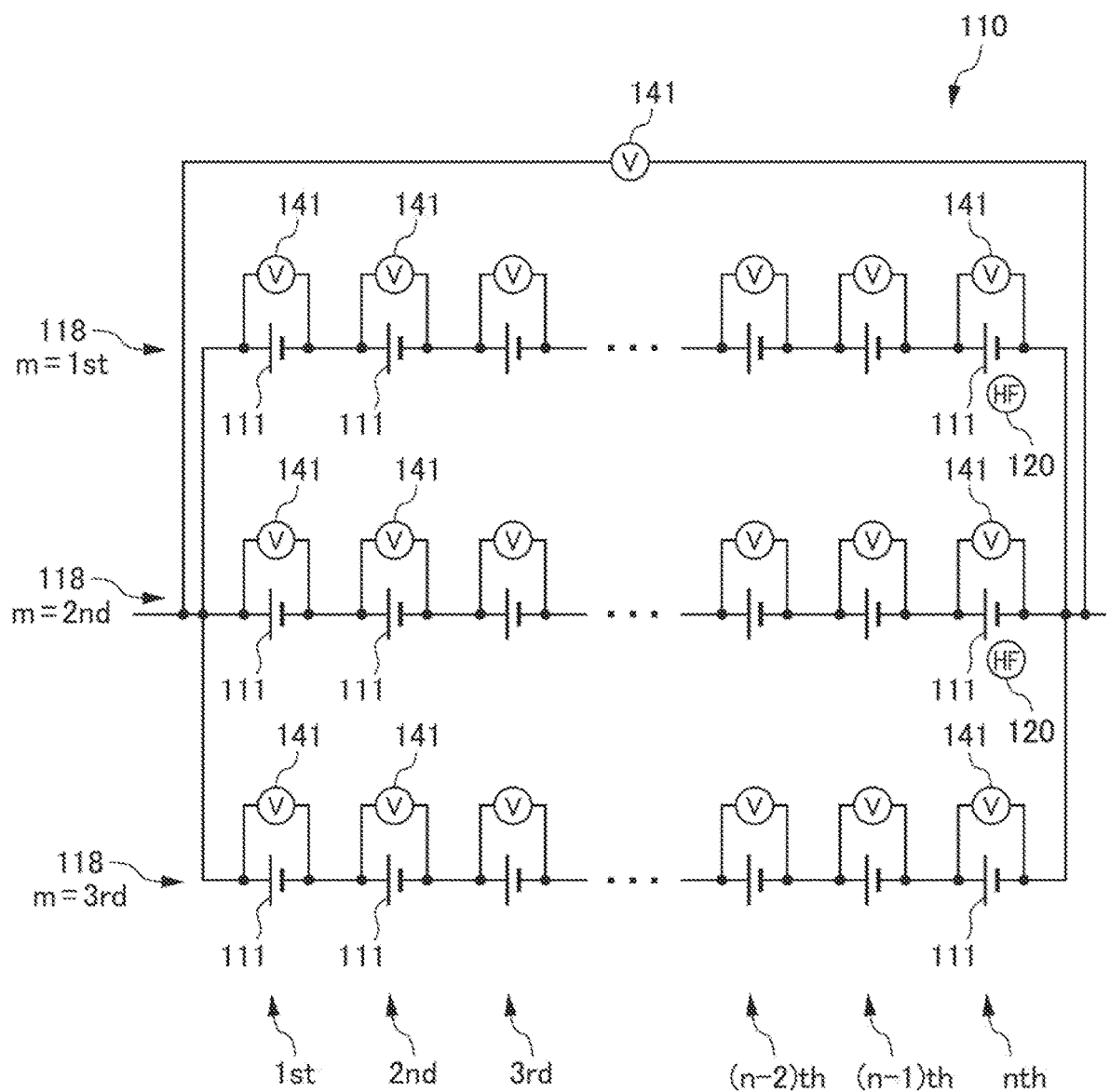
FIG. 7 is a diagram illustrating an example of SOC Estimation 3 for battery cells according to an embodiment.

Next, an example of SOC estimation is described by referring to FIG. 7, which illustrates a case where the battery module 110 includes m battery cell groups 118 (m=3 in the example of FIG. 7) connected in parallel, and each of the m battery cell groups 118 includes n battery cells 111 connected in series.

In this case, the voltage detector 141 includes (m×n) voltage detectors 141 provided to the (m×n) battery cells 111 on a one-to-one basis, and a further one voltage detector 141 provided to the battery module 110. Each of the (m×n) voltage detectors 141 detects a voltage of an associated one of the (m×n) battery cells 111, while the further one voltage detector 141 detects a composite voltage of the m battery cell groups 118 connected in parallel.

In this case, the battery heat flow detector 120 includes ((m−1)×1) battery heat flow detectors 120 each provided to one battery cell 111 among the n battery cells 111 included in each of (m−1) battery cell groups 118 among the m battery cell groups 118. Each of the battery heat flow detectors 120 detects, for an associated one of the (m−1) battery cell groups 118, a heat flow of the one battery cell 111.

In each of the (m−1) battery cell groups 118, the n battery cells are numbered in the same direction. For example, in FIG. 7, the n battery cells are numbered in the left-to-right direction. In this case, it is preferable that the ((m−1)×1) battery heat flow detectors 120 are each provided to one battery cell 111 among the n battery cells 111 included in each of the (m−1) battery cell groups 118, the one battery cell being denoted by the same ordinal number in the (m−1) battery cell groups 118. For example, in FIG. 7, in each of the (m−1) battery cell groups 118, one battery heat flow detector 120 is provided to the nth battery cell 111 from the left. In this way, the battery heat flow detectors 120 are arranged at positions aligned over all the (m−1) battery cell groups 118 (for example, in proximity to the center or in proximity to an end of each battery cell group 118). This arrangement makes it possible to reduce errors in the detected heat flow that can be caused depending on arrangement positions of the battery heat flow detectors 120 in the battery cell groups 118. As a result, variance in the estimation accuracy for the SOC, variance in the estimation accuracy for the OCV, and/or variance in the estimation accuracy for the CCV of the battery cells 111 can be reduced between the battery cell groups 118.

The battery state estimator 210 estimates SOCs of all the (m×n) battery cells 111, based on the voltage detected for each of the (m×n) battery cells 111, the composite voltage detected for the m battery cell groups 118, the heat flow detected for each of ((m−1)×1) battery cells 111, the table map of the OCV vs. SOC characteristics (A1), and the table map of the HF vs. SOC characteristics (A2).

Specifically, the battery state estimator 210 determines, for each of the (m−1) battery cell groups 118, a true SOC of one battery cell 111 that corresponds to the heat flow detected for the one battery cell 111, based on the table map of the HF vs. SOC characteristics (A2) (FIG. 4). For example, in the case illustrated in FIG. 7, the battery state estimator 210 determines, for each of the (m−1) battery cell groups 118, a true SOC of the nth battery cell 111 from the left.

Next, the battery state estimator 210 determines, for each of the (m−1) battery cell groups 118, an OCV of the one battery cell 111 that corresponds to the true SOC determined for the one battery cells 111, based on the table map of the OCV vs. SOC characteristics (A1) (FIG. 3). For example, in the case illustrated in FIG. 7, the battery state estimator 210 determines, for each of the (m−1) battery cell groups 118, an OCV of the nth battery cell 111 from the left.

Next, the battery state estimator 210 calculates, for each of the (m−1) battery cell groups 118, a differential voltage (OCV) between the OCV determined for the one battery cell 111 and the voltage detected for the one battery cell 111. For example, in the case illustrated in FIG. 7, the battery state estimator 210 calculates, for each of the (m−1) battery cell groups 118, a differential voltage (OCV) between the voltage detected and the OCV calculated for the nth battery cell 111 from the left.

Here, in each battery cell group 118, the battery cells 111 are in the same temperature environment. Therefore, the battery cells 111 in the same battery cell group 118 have the same differential voltage (OCV) between the detected voltage and the OCV. Accordingly, the battery state estimator 210 subsequently calculates, for each of the (m−1) battery cell groups 118, an OCV of each of remaining (n−1) battery cells 111, from the voltage detected for each of the remaining (n−1) battery cells 111 and the calculated differential voltage (OCV). For example, in the case illustrated in FIG. 7, the battery state estimator 210 calculates, for each of the (m−1) battery cell groups 118, an OCV of each of the remaining first to (n−1)th battery cells 111, from the voltage detected for each of the remaining first to (n−1)th battery cells 111 and the differential voltage (OCV) of the nth battery cell 111.

Next, the battery state estimator 210 determines, for each of the (m−1) battery cell groups 118, a true SOC of each of the remaining (n−1) battery cells 111 that corresponds to the OCV calculated for each of the remaining (n−1) battery cells 111, based on the table map of the OCV vs. SOC characteristics (A1) (FIG. 3). For example, in the case illustrated in FIG. 7, the battery state estimator 210 determines, for each of the (m−1) battery cell groups 118, a true SOC of each of the remaining first to (n−1)th battery cells 111.

Next, for each of the (m−1) battery cell groups 118, the battery state estimator 210 calculates a total OCV, from the OCV determined for the one battery cell 111 and the OCV of each of the remaining (n−1) battery cells 111. For example, in the case illustrated in FIG. 7, the battery state estimator 210 calculates, for each of the first and second battery cell groups 118 from the top, a total OCV of the n battery cells 111 connected in series, from the OCV of the nth battery cell 111 and the OCV of the remaining first to (n−1)th battery cells 111.

Next, the battery state estimator 210 calculates a total OCV of remaining one battery cell group 118, from the total OCV of each of the (m−1) battery cell groups 118 and the composite voltage detected for the m battery cell groups 118. For example, in the case illustrated in FIG. 7, the battery state estimator 210 calculates a total OCV of the third battery cell group 118, from the total OCV of each of the first and second battery cell groups 118 and the composite voltage of the three battery cell groups 118.

Next, the battery state estimator 210 calculates, for the remaining one battery cell group 118, a total detected voltage of the n battery cells 111, from the voltage detected for each of the n battery cells 111. For example, in the case illustrated in FIG. 7, the battery state estimator 210 calculates, for the third battery cell group 118, a total detected voltage of the n battery cells 111.

Next, the battery state estimator 210 calculates, for the remaining one battery cell group 118, a total differential voltage (OCV) of the n battery cells 111, from a difference between the calculated total OCV and the calculated total detected voltage. For example, in the case illustrated in FIG. 7, the battery state estimator 210 calculates, for the third battery cell group 118, a total differential voltage (OCV) of the n battery cells 111, which is the difference between the total OCV and the total detected voltage.

Here, in each battery cell group 118, the battery cells 111 are in the same temperature environment. Therefore, the battery cells 111 in the same battery cell group 118 have the same differential voltage (OCV) between the detected voltage and the OCV. Accordingly, the battery state estimator 210 subsequently calculates, for the remaining one battery cell group 118, a differential voltage (OCV) of each of the n battery cells 111 by equally dividing the total differential voltage (OCV) calculated for the n battery cells 111. For example, in the case illustrated in FIG. 7, the battery state estimator 210 calculates, for the third battery cell group 118, a differential voltage (OCV) of each of the n battery cells 111.

Next, the battery state estimator 210 calculates, for the remaining one battery cell group 118, an OCV of each of the n battery cells 111, from the voltage detected for each of the n battery cells 111 and the differential voltage (OCV) calculated for each of the n battery cells 111. For example, in the case illustrated in FIG. 7, the battery state estimator 210 calculates, for the third battery cell group 118, an OCV of each of the n battery cells 111.

Next, the battery state estimator 210 determines, for the remaining one battery cell group 118, a true SOC of each of the n battery cells 111 that corresponds to the OCV calculated for each of the n battery cells, based on the table map of the OCV vs. SOC characteristics (A1) (FIG. 3). For example, in the case illustrated in FIG. 7, the battery state estimator 210 determines, for the third battery cell group 118, a true SOC of each of the n battery cells 111.

As described above, SOC Estimation 3 of the present embodiment, according to which the SOC of each battery cell is estimated on the basis of the heat flow detected for the battery cell and with reference to the HF vs. SOC characteristics, also makes it possible to estimate the SOC of each battery cell with improved accuracy, like SOC Estimation 1 and SOC Estimation 2 described above. As a result, overcharge and overdischarge of each battery cell can be suppressed. Furthermore, SOC Estimation 3 of the present embodiment also makes it possible to estimate the OCV of each of the battery cells connected in parallel, like SOC Estimation 1 and SOC Estimation 2 described above. As a result, charge and discharge of each battery cell can be safely controlled such that the voltage of each battery cell can be prevented from falling outside the upper and lower limits of a voltage range.

Furthermore, SOC Estimation 3 of the present embodiment also allows a smaller number of the battery heat flow detectors 120 to be used, with respect to the number of battery cells 111 (i.e., the ((m−1) x1) battery heat flow detectors 120 with respect to the (m×n) battery cells 111). In other words, in terms of n battery cells connected in series, the number of the battery heat flow detectors to be used can be reduced by (n+1). Furthermore, in terms of m battery cell groups connected in parallel, the number of the battery heat flow detectors to be used can be reduced by one. Thus, the estimation accuracy for the SOC and OCV of each battery cell can be improved while reducing an increase in cost.

According to SOC estimation 3 of the present embodiment, a CCV of each battery cell 111 may be estimated based on the table map the CCV vs. SOC characteristics (A11). Specifically, for each of the (m−1) battery cell groups 118, the battery state estimator 210 may perform the estimation by:

determining, based on the table map of the CCV vs. SOC characteristics (A11), a CCV of the one battery cell 111 that corresponds to the true SOC of the one battery cell 111 determined in the above-described manner;

calculating a differential voltage (CCV) between the CCV determined for the one battery cell 111 and the voltage detected for the one battery cell 111; and calculating the CCV of each of the remaining (n−1) battery cells 111, from the voltage detected for each of the remaining (n−1) battery cells 111 and the calculated differential voltage (CCV).

Subsequently, the battery state estimator 210 continues the estimation by:

calculating, for each of the (m−1) battery cell groups 118, a total CCV, from the CCV determined for the one battery cell 111 and the CCV determined for each of the (n−1) battery cells 111; and calculating a total CCV of the remaining one battery cell group 118, from the total CCV of each of the (m−1) battery cell groups 118 and the composite voltage detected for the m battery cell groups 118.

Next, for the remaining one battery cell group 118, the battery state estimator 210 continues the estimation by:

calculating a total differential voltage (CCV) of the n battery cells 111, from a difference between the calculated total CCV and the calculated total detected voltage;

calculating a differential voltage (CCV) of each of the n battery cells 111 by equally dividing the calculated total differential voltage (CCV) of the n battery cells 111; and calculating a CCV of each of the n battery cells 111, from the voltage detected for each of the n battery cells 111 and the differential voltage (CCV) calculated for each of the n battery cells 111.

As a result, charge and discharge of each battery cell can be safely controlled such that the voltage of each battery cell can be prevented from falling outside the upper and lower limits of a voltage range.

While embodiments of the present disclosure have been described in the foregoing, the present disclosure is not limited to the embodiments described above, and can be implemented with various changes and modifications.

EXPLANATION OF REFERENCE NUMERALS

- 100: Battery unit
- 101: Case
- 102: Cover
- 103: Lower frame
- 104: Upper frame
- 105: Cooling plate
- 106: Air introduction mechanism
- 110: Battery module
- 111: Battery cell
- 112: Stack
- 113: End plate
- 114: Cell bus bar
- 118: Battery cell group
- 119: Module bus bar
- 120: Battery heat flow detector
- 130: Reference heat flow detector
- 141: Voltage detector
- 142: Current detector
- 143: Temperature detector
- 200: Battery management system (BMS)
- 210: Battery state estimator
- 220: Storage

What is claimed is:

1. A battery unit comprising:
   a battery module including battery cells, the battery module including m battery cell groups connected in series, each of the m battery cell groups including n battery cells among the battery cells, the n battery cells being connected in parallel in each of the m battery cell groups, the battery cells totaling (m×n) battery cells;

m voltage detectors provided to the m battery cell groups on a one-to-one basis, each of the m voltage detectors being configured to detect, for an associated one of the m battery cell groups, a composite voltage of the n battery cells;

(m×(n−1)) battery heat flow detectors provided, on a one-to-one basis, to (n−1) battery cells among the n battery cells included in each of the m battery cell groups, each of the (m×(n−1)) battery heat flow detectors being configured to detect a heat flow of an associated one of the (n−1) battery cells;

a storage configured to store (A1) and (A2) below,
   (A1): a table map of open circuit voltage OCV vs. state of charge SOC characteristics of the battery cell, and
   (A2): a table map of heat flow HF vs. SOC characteristics of the battery cell; and a battery state estimator configured to estimate SOCs of all the (m×n) battery cells, based on the composite voltage detected for each of the m battery cell groups, the heat flow detected for each of (m×(n−1)) battery cells among the (m×n) battery cells, the (A1), and the (A2), wherein for each of the m battery cell groups, the battery state estimator is configured to:
   determine, based on the (A2), a true SOC of each battery cell of the (n−1) battery cells, the true SOC corresponding to the heat flow detected for the battery cell,
   determine, based on the (A1), an OCV of each battery cell of the (n−1) battery cells, the OCV corresponding to the true SOC determined for the battery cell,
   calculate an OCV of a remaining one battery cell, from the OCV determined for each battery cell of the (n−1) battery cells and the composite voltage detected, and
   determine, based on the (A1), a true SOC of the remaining one battery cell, the true SOC corresponding to the OCV calculated for the remaining one battery cell.

2. The battery unit according to claim 1,
   wherein in a case where the n battery cells in each of the m battery cell groups are numbered in a same direction, the (m×(n−1)) battery heat flow detectors are provided to the (n−1) battery cells among the n battery cells included in each of the m battery cell groups, the (n−1) battery cells being denoted by same ordinal numbers in the m battery cell groups.

3. The battery unit according to claim 1,
   wherein the storage is configured to further store (A11) below,
   (A11): a table map of closed circuit voltage CCV vs. SOC characteristics of the battery cell, and
   wherein for each of the m battery cell groups, the battery state estimator is further configured to:
   determine, based on the (A11), a CCV of each battery cell of the (n−1) battery cells, the CCV corresponding to the true SOC determined for the battery cell, and
   calculate a CCV of the remaining one battery cell, from the CCV determined for each battery cell of the (n−1) battery cells and the composite voltage detected.

4. The battery unit according to claim 1, further comprising:
a reference heat flow detector configured to detect a heat flow of the battery unit as a reference heat flow,
wherein the battery state estimator subtracts the reference heat flow detected by the reference heat flow detector from the heat flow detected by the battery heat flow detectors to thereby calculate a heat flow excluding effects of the heat flow of the battery unit, and uses the heat flow excluding the effects of the heat flow of the battery unit as the heat flow of the battery cell.

5. A battery unit comprising:
a battery module including battery cells, the battery module including m battery cell groups connected in parallel, each of the m battery cell groups including n battery cells among the battery cells, the n battery cells being connected in series in each of the m battery cell groups, the battery cells totaling (m×n) battery cells;
(m×n) voltage detectors provided to all the (m×n) battery cells on a one-to-one basis, each of the (m×n) voltage detectors being configured to detect a voltage of an associated one of the (m×n) battery cells;
(m×1) battery heat flow detectors each provided to one battery cell among the n battery cells included in each of the m battery cell groups, each of the (m×1) battery heat flow detectors being configured to detect a heat flow of the one battery cell;
a storage configured to store (A1) and (A2) below,
(A1): a table map of open circuit voltage OCV vs. state of charge SOC characteristics of the battery cell, and
(A2): a table map of heat flow HF vs. SOC characteristics of the battery cell; and
a battery state estimator configured to estimate SOCs of all the (m×n) battery cells, based on the voltage detected for each of the (m×n) battery cells, the heat flow detected for each of (m×1) battery cells among the (m×n) battery cells, the (A1), and the (A2),
wherein for each of the m battery cell groups, the battery state estimator is configured to:
determine, based on the (A2), a true SOC of the one battery cell, the true SOC corresponding to the heat flow detected for the one battery cell,
determine, based on the (A1), an OCV of the one battery cell, the OCV corresponding to the true SOC determined for the one battery cell,
calculate an OCV differential voltage between the OCV determined for the one battery cell and the voltage detected for the one battery cell,
calculate an OCV of each of remaining (n−1) battery cells among the n battery cells, from the voltage detected for each of the remaining (n−1) battery cells and the OCV differential voltage calculated, and
determine, based on the (A1), a true SOC of each of the remaining (n−1) battery cells, the true SOC corresponding to the OCV calculated for each of the remaining (n−1) battery cells.

6. The battery unit according to claim 5,
wherein in a case where the n battery cells in each of the m battery cell groups are numbered in a same direction, the (m×1) battery heat flow detectors are each provided to the one battery cell among the n battery cells included in each of the m battery cell groups, the one battery cell being denoted by a same ordinal number in the m battery cell groups.

7. The battery unit according to claim 5,
wherein the storage is configured to further store (A11) below,
(A11): a table map of closed circuit voltage CCV vs. SOC characteristics of the battery cell, and
wherein for each of the m battery cell groups, the battery state estimator is further configured to:
determine, based on the (A11), a CCV of the one battery cell, the CCV corresponding to the true SOC determined for the one battery cell,
calculate a CCV differential voltage between the CCV determined for the one battery cell and the voltage detected for the one battery cell, and
calculate a CCV of each of the remaining (n−1) battery cells, from the voltage detected for each of the remaining (n−1) battery cells and the CCV differential voltage calculated.

8. The battery unit according to claim 5, further comprising:
a reference heat flow detector configured to detect a heat flow of the battery unit as a reference heat flow,
wherein the battery state estimator subtracts the reference heat flow detected by the reference heat flow detector from the heat flow detected by the battery heat flow detectors to thereby calculate a heat flow excluding effects of the heat flow of the battery unit, and uses the heat flow excluding the effects of the heat flow of the battery unit as the heat flow of the battery cell.

9. A battery unit comprising:
a battery module including battery cells, the battery module including m battery cell groups connected in parallel, each of the m battery cell groups including n battery cells among the battery cells, the n battery cells being connected in series in each of the m battery cell groups, the battery cells totaling (m×n) battery cells;
(m×n) voltage detectors provided to all the (m×n) battery cells on a one-to-one basis, each of the (m×n) voltage detectors being configured to detect a voltage of an associated one of the (m×n) battery cells;
one voltage detector provided to the battery module and configured to detect a composite voltage of the m battery cell groups;
((m−1)×1) battery heat flow detectors each provided to one battery cell among the n battery cells included in each of (m−1) battery cell groups among the m battery cell groups, each of the ((m−1)×1) battery heat flow detectors being configured to detect a heat flow of the one battery cell;
a storage configured to store (A1) and (A2) below,
(A1): a table map of open circuit voltage OCV vs. state of charge SOC characteristics of the battery cell, and
(A2): a table map of heat flow HF vs. SOC characteristics of the battery cell; and
a battery state estimator configured to estimate SOCs of all the (m×n) battery cells, based on the voltage detected for each of the (m×n) battery cells, the composite voltage detected for the m battery cell groups, the heat flow detected for each of ((m−1)×1) battery cells among the (m×n) battery cells, the (A1), and the (A2),
wherein for each of the (m−1) battery cell groups, the battery state estimator is configured to:
determine, based on the (A2), a true SOC of the one battery cell, the true SOC corresponding to the heat flow detected for the one battery cell,
determine, based on the (A1), an OCV of the one battery cell, the OCV corresponding to the true SOC determined for the one battery cell, calculate an OCV differential voltage between the OCV determined for the one battery cell and the voltage detected for the one battery cell, calculate an OCV of each of remaining (n−1) battery cells among the n battery cells, from the voltage detected for each of the remaining (n−1) battery cells and the OCV differential voltage calculated, determine, based on the (A1), a true SOC of each of the remaining (n−1) battery cells, the true SOC corresponding to the OCV calculated for each of the remaining (n−1) battery cells, calculate a total OCV of each of the (m−1) battery cell groups, from the OCV determined for the one battery cell and the OCV determined for each of the remaining (n−1) battery cells, and calculate a total OCV of remaining one battery cell group of the m battery cell groups, from the total OCV calculated for each of the (m−1) battery cell groups and the composite voltage detected for the m battery cell groups, and wherein for the remaining one battery cell group, the battery state estimator is further configured to:

calculate a total detected voltage of the n battery cells, from the voltage detected for each of the n battery cells, calculate a total OCV differential voltage of the n battery cells, from a difference between the total OCV calculated and the total detected voltage calculated, calculate an OCV differential voltage of each of the n battery cells by equally dividing the total OCV differential voltage calculated for the n battery cells, calculate an OCV of each of the n battery cells, from the voltage detected for each of the n battery cells and the OCV differential voltage calculated for each of the n battery cells, and determine, based on the (A1), a true SOC of each of the n battery cells, the true SOC corresponding to the OCV calculated for each of the n battery cells.

10. The battery unit according to claim 9, wherein in a case where the n battery cells in each of the (m−1) battery cell groups are numbered in a same direction, the ((m−1)×1) battery heat flow detectors are each provided to the one battery cell among the n battery cells included in each of the (m−1) battery cell groups, the one battery cell being denoted by a same ordinal number in the (m−1) battery cell groups.

11. The battery unit according to claim 9, wherein the storage is configured to further store (A11) below, (A11): a table map of closed circuit voltage CCV vs. SOC characteristics of the battery cell, and wherein for each of the (m−1) battery cell groups, the battery state estimator is further configured to:

determine, based on the (A11), a CCV of the one battery cell, the CCV corresponding to the true SOC determined for the one battery cell, calculate a CCV differential voltage between the CCV determined for the one battery cell and the voltage detected for the one battery cell, calculate a CCV of each of the remaining (n−1) battery cells, from the voltage detected for each of the remaining (n−1) battery cells and the CCV differential voltage calculated, calculate a total CCV of each of the (m−1) battery cell groups, from the CCV determined for the one battery cell and the CCV determined for each of the remaining (n−1) battery cells, and calculate a total CCV of remaining one battery cell group of the m battery cell groups, from the total CCV calculated for each of the (m−1) battery cell groups and the composite voltage detected for the m battery cell groups, and wherein for the remaining one battery cell group, the battery state estimator is further configured to:

calculate a total CCV differential voltage of the n battery cells, from a difference between the total CCV calculated and the total detected voltage calculated, calculate a CCV differential voltage of each of the n battery cells by equally dividing the total CCV differential voltage calculated for the n battery cells, and calculate a CCV of each of the n battery cells, from the voltage detected for each of the n battery cells and the CCV differential voltage calculated for each of the n battery cells.

12. The battery unit according to claim 9, further comprising:

a reference heat flow detector configured to detect a heat flow of the battery unit as a reference heat flow, wherein the battery state estimator subtracts the reference heat flow detected by the reference heat flow detector from the heat flow detected by the battery heat flow detectors to thereby calculate a heat flow excluding effects of the heat flow of the battery unit, and uses the heat flow excluding the effects of the heat flow of the battery unit as the heat flow of the battery cell.

* * * * *